United States Patent [19]

Hayano

[11] Patent Number: 4,929,989
[45] Date of Patent: May 29, 1990

[54] MOS TYPE SEMICONDUCTOR DEVICE POTENTIAL STABILIZING CIRCUIT WITH SERIES MOS CAPACITORS

[75] Inventor: Kiminori Hayano, Tokyo, Japan

[73] Assignee: NEC Corporation, Tokyo, Japan

[21] Appl. No.: 349,093

[22] Filed: May 9, 1989

[30] Foreign Application Priority Data

May 10, 1988 [JP] Japan .................................. 63-114292

[51] Int. Cl.⁵ ...................... H01L 29/78; H01L 27/02; H03K 3/01
[52] U.S. Cl. ...................................... 357/23.6; 357/41; 307/296.8
[58] Field of Search .............................. 357/23.6, 41; 307/296.8

[56] References Cited

U.S. PATENT DOCUMENTS 4,758,873  7/1988  Monticelli ........................... 357/23.6
4,769,784  9/1988  Doluca et al. ..................... 307/296.8

Primary Examiner—Gene M. Munson

[57] ABSTRACT

A MOS type semiconductor device forming an insulated gate field effect transistor and a potential stabilizing circuit connected between power voltage supply lines is disclosed. The potential stabilizing circuit includes first and second MOS type capacitors connected in series each other, and the dielectric film of each of the MOS type capacitors has the same thickness and is made of the same material as the gate insulating film of the transistor.

6 Claims, 3 Drawing Sheets

MOS TYPE SEMICONDUCTOR DEVICE POTENTIAL STABILIZING CIRCUIT WITH SERIES MOS CAPACITORS

BACKGROUND OF THE INVENTION:

1. Field of the Invention

The present invention relates to a MOS type semiconductor device, and more particularly, to a potential stabilizing circuit connected between power voltage supply lines of different potentials each other.

2. Description of Related Art

To suppress a potential fluctuation on power voltage supply lines (Vcc line and ground line, for example) caused by an operation of a signal generation circuit, etc., a potential stabilizing circuit including a capacitor called as bypass capacitor or decoupling capacitor is connected between these power voltage supply lines, because the potential fluctuation adversely affects operation speeds, etc. of the device, and in the worst case, it causes erroneous operations.

The bypass capacitor is favorably of a MOS type capacitor when the semiconductor device includes a plurality of insulated gate field effect transistors (MOS type transistors), because the MOS type capacitor can be manufactured with the transistors in the same process steps thereby obtaining a good productivity. Consequently, the dielectric film of the MOS capacitor has the same thickness and material as the gate insulating film of the transistor. Therefore, when the transistor necessitates a thinner gate insulating film such as 200 Å to 400 Å to meet a demand of high integration density of device, the dielectric film of the bypass capacitor becomes inevitably the same thin thickness.

In a prior art, the potential stabilizing circuit is constituted such that an upper electrode of a MOS type capacitor is connected to a Vcc (+5 volts) power supply line; a lower electrode of the MOS type capacitor, which lower electrode is an impurity region formed in the substrate, is connected to a ground (0 volts) line; and the dielectric film of the MOS type capacitor between the upper and lower electrodes is made of silicon oxide and has the same thin thickness as the silicon oxide gate insulating film of the transistor.

The semiconductor devices forming the conventional potential stabilizing circuit mentioned above, however, represent low reliability through reliability estimation tests or acceleration tests (operating the device with a higher power supply voltage under a high temperature) causing by a breakdown of the thin dielectric film of the capacitor; although the thin gate insulating films of the transistors maintain good state. The reason is suggested that a high electric field is continuously applied to the dielectric film of the bypass capacitor during the power supply voltages are supplied to the device, that is, to the bonding pads thereof, while it is applied to the gate insulating film of each transistor only when the transistor is in an operating state. To avoid this disadvantage, on the other hand, if the dielectric film is formed thicker than the gate insulating film, complexity of manufacturing of the device is inevitable.

SUMMARY OF THE INVENTION:

Accordingly, it is an object of the present invention to provide a semiconductor device in which a potential stabilizing circuit for suppressing a potential fluctuation on the power voltage supply line is formed in a reliable and productive structure.

According to one feature of the present invention, there is provided a semiconductor device which comprises a semiconductor substrate having a major surface of a first conductivity type, a thick field insulating layer selectively formed on the major surface of the substrate, a first power voltage supply line for supplying a first voltage extending on the thick field insulating layer, a second power voltage supply line for supplying a second voltage different from the first voltage extending on the thick field insulating layer, an insulated gate field effect transistor formed on the substrate, the transistor having a gate insulating film formed on the major surface of the substrate, a first impurity region of a second conductivity type opposite to the first conductivity type formed in the major surface of the substrate and surrounded by the thick field insulating layer, a first dielectric film formed on the first impurity region, the first dielectric film being made of the same material as the gate insulating film of the transistor and having the same thickness as the gate insulating film of the transistor, a first electrode formed on the first dielectric film, a second impurity region of the second conductivity type formed in the major surface of the substrate and surrounded by the thick field insulating layer, a second dielectric film formed on the second impurity region, the second dielectric film being made of the same material as the gate insulating film of the transistor and having the same thickness as the gate insulating film of the transistor, a second electrode formed on the second dielectric film, a first connecting means for connecting electrically the first power voltage supply line and the first impurity region each other, a second connecting means for connecting electrically the first electrode and the second impurity region each other, and a third connecting means for connecting electrically the second impurity region and the second power voltage supply line each other; whereby a first MOS type capacitor is constituted by the first impurity region, the first dielectric film and the first electrode, and a second MOS type capacitor is constituted by the second impurity region, the second dielectric film and the second electrode; and a potential stabilizing circuit for suppressing a voltage fluctuation on the first and/or second power voltage supply line is constituted by the series connection of the first and second MOS type capacitors and is connected to and between the first and second power voltage supply lines.

Another feature of the present invention is that a semiconductor device comprises a semiconductor substrate having a memory cell forming section and a peripheral section positioned outside the memory cell forming section, first and second power voltage supply lines formed on the peripheral section, respectively, at least one insulated gate field effect transistor formed on the peripheral section and having a gate insulating film, a plurality of MOS type capacitors formed on the peripheral section and connected each other in series to form a series connection of the capacitors, a first means for connecting one end of the series connection of the capacitors to the first power voltage supply line, and a second means for connecting the other end of the series connection of the capacitors to the second power voltage supply line, each of the capacitor having a dielectric film of the same thickness and material as the gate insulating film of the transistor. Considering the reliability of the potential stabilizing circuit and the area occupied by the circuit, the series connection is preferably constituted by two of capacitors such that one electrode of a first capacitor and one electrode of a second capacitor are electrically connected to power voltage supply lines, respectively, and the other electrode of the first capacitor and the other electrode of the second capacitor is electrically connected to each other. Practically, the present invention is more useful when the thickness of the dielectric film of the MOS capacitor and of the gate insulating film of the transistor ranges from 200 Å to 400 Å.

Figure 1A:
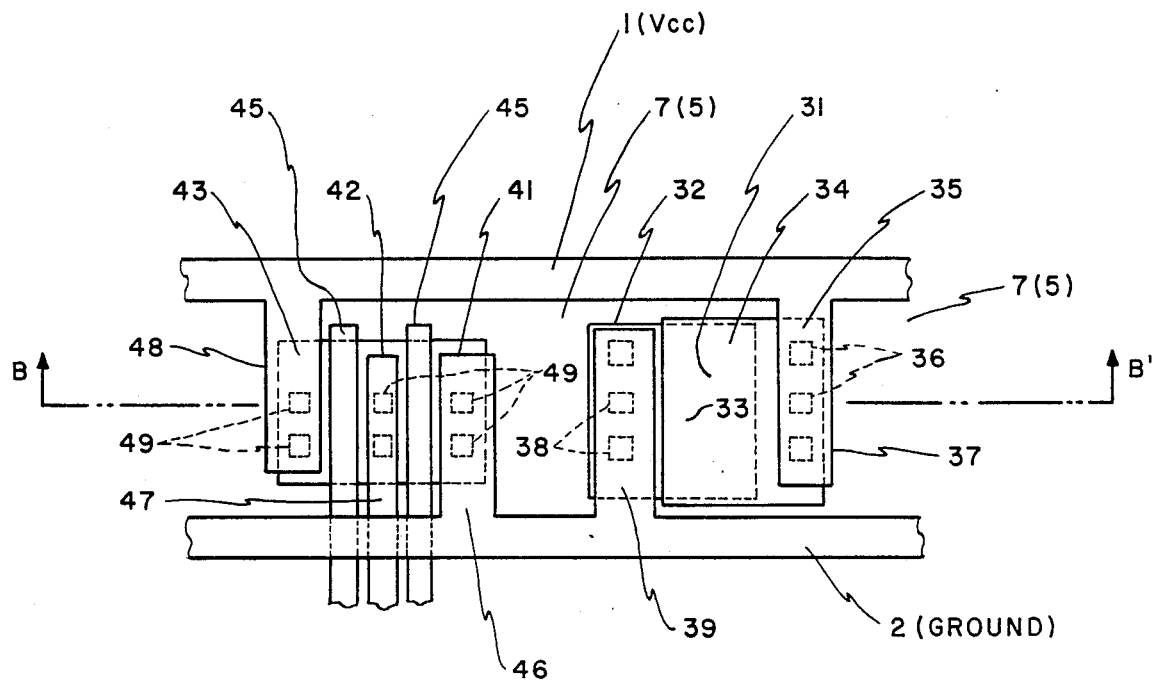
FIG. 1A is a plan view showing a part of a semiconductor device including a conventional potential stabilizing circuit.
Figure 1B:
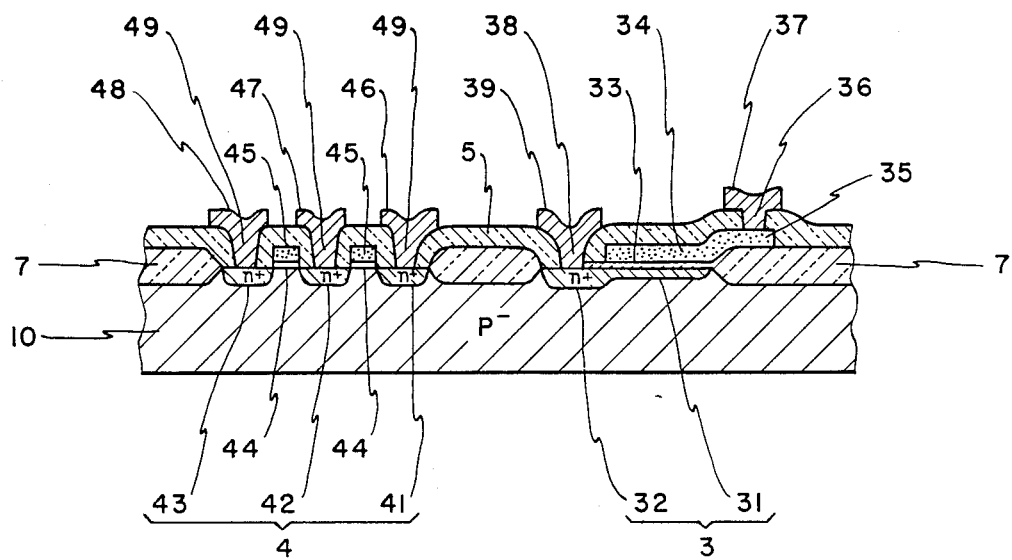
FIG. 1B is a cross-sectional view taken along line B—B' in FIG. 1A as viewed in the direction of arrows.
Figure 2:
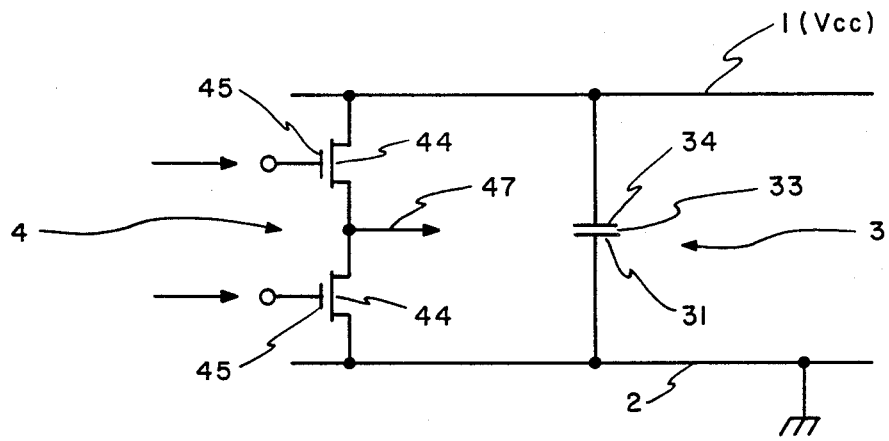
FIG. 2 is a circuit diagram of FIGS. 1A and 1B.

DESCRIPTION OF A PRIOR ART:

Referring to FIGS. 1A, 1B and 2, a semiconductor device in a prior art will be explained. On a major surface of a P⁻-type silicon substrate 10, a thick silicon oxide field insulating layer 7 of 1.0 μm thickness is selectively formed. A transistor forming portion and a capacitor forming portion of the substrate are surrounded by the field insulating layer. In the transistor forming section, N⁺-type source, drain regions 41, 42, 43 are formed, and on the major surface of the substrate between the regions 41, 42 and between the regions 42, 43, gate insulating films 44 of silicon oxide grown by thermal oxidation of the silicon substrate 10 and having 250 Å thickness are formed, respectively, and on the respective gate insulating films, polycrystalline silicon gates 45 are formed to constitute a dual-gate type field effect transistor (dual-gate MOST) 4. The N⁺-type region 41 is electrically connected to a ground voltage (0 volts) line 2 of aluminum by an aluminum wiring layer 46 through contact holes 49 formed in an inter-ply insulating layer 5 of PSG, and also, the N⁺-type region 43 is electrically connected to a Vcc voltage (+5.0 volts) line 1 of aluminum by an aluminum wiring layer 48 through contact holes 49. The N⁺-type region 42 is connected to an aluminum wiring layer 47 through contact holes 49. The transistor receives input signals to the gate electrodes 45, and sends output signals from the wiring layer 47. In the capacitor forming portion, an N⁺-type impurity region 31 serving as a lower electrode of a bypass capacitor 3 of the potential stabilizing circuit and an N⁺-type impurity region 32 serving as a contact part for the region 31 are continuously formed. A dielectric film 33 of the capacitor 3 made of silicon oxide by thermal oxidation of the silicon substrate 10 and having 250 Å thickness is formed on the N⁺-type impurity region 31 with the formation of the gate insulating films 44 through a heat treatment under oxygen or steam atmosphere. A polycrystalline silicon electrode 34 serving as an upper electrode of the capacitor 3 is formed on the dielectrid film 33, and a contact part 35 of polycrystalline silicon is continuously formed with the electrode 34, on the field insulating layer 7. The lower electrode 31 of the capacitor is electrically connected to the ground voltage line 2 through the N⁺-type region 32, contact holes 38 formed in the inter-ply insulating layer 5 and an aluminum wiring layer 39, and the upper electrode 34 of the capacitor is electrically connected to the Vcc voltage line 1 through the polycrystalline silicon contact part 35, contact holes 36 formed in the inter-ply insulating layer 5 and an aluminum wiring layer 37.

DETAILED DESCRIPTION OF THE EMBODIMENT:

The embodiment of the present invention will be explained by referring FIGS. 3 to 5, in which the same components as those in FIGS. 1 and 2 are indicated by the same reference numerals.

Figure 3:
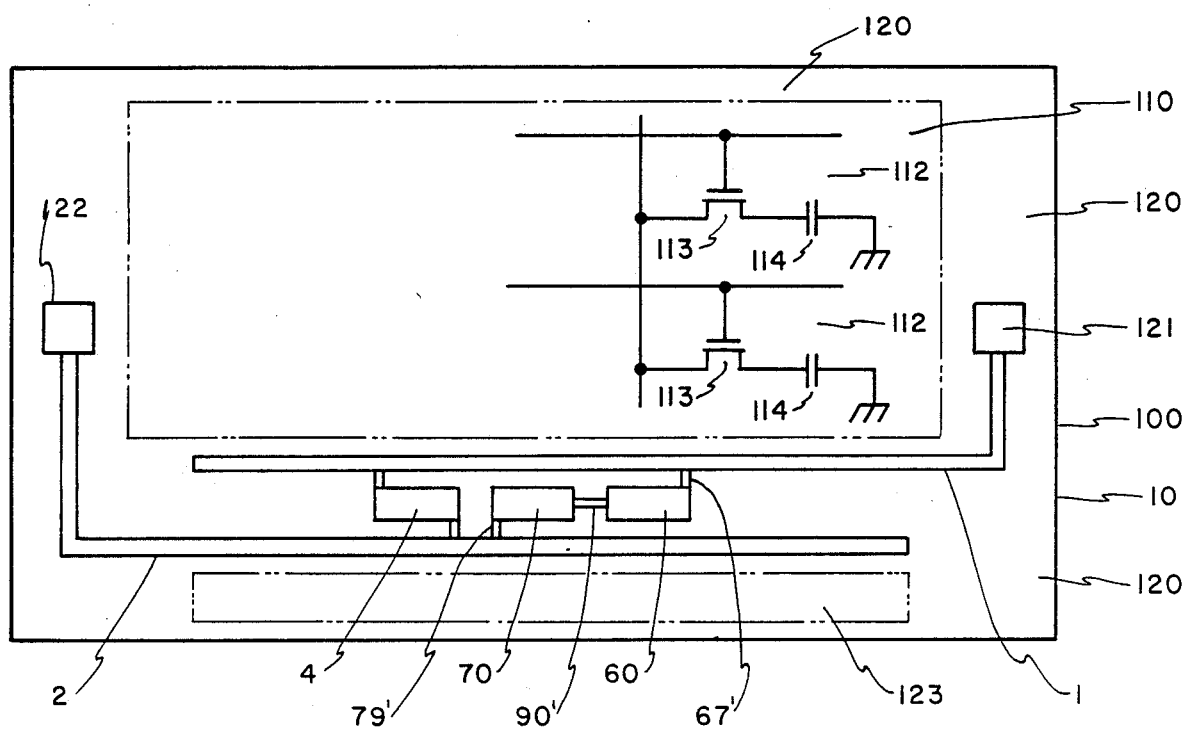
FIG. 3 is a plan view of a semiconductor device forming a potential stabilizing circuit according to an embodiment of the present invention.

Referring to FIG. 3, a semiconductor memory device (semiconductor chip or pellet) 100 has a memory cell forming section 110 at the center of the silicon substrate 10, and a peripheral section 120 surrounding the memory cell forming section 110. A plurality of dynamic random access memory cell 112 each including a switching insulated gate field effect transistor 113 and a storage capacitor 114 are formed in the memory cell forming section 110. The switching transistor 113 has the gate insulating film of 250 Å thickness made of thermally grown silicon oxide. On the other hand, in the peripheral section 120, a bonding pad 121 connected to the Vcc (+5 volts) line 1 and a bonding pad 122 connected to the ground potential (0 volts) line are formed for supplying respective power voltages to the device. Further, another wiring layer forming portion 123 is provided. The transistor 4 as in FIGS. 1 and 2 is formed between and connected to the power voltage supply lines 1, 2. A first MOS type bypass capacitor 60 is formed and connected to the Vcc line 1 through a connecting means 67', and a second MOS type bypass capacitor 70 is formed and connected to the first MOS type bipass capacitor 60 through a connecting means 90' and to the ground potential line 2 through a connecting means 79' so that the first and second bypass capacitors are connected in series each other and arranged in a direction parallel with the power supply lines 1, 2, in the plan lay-out.

Figure 5:
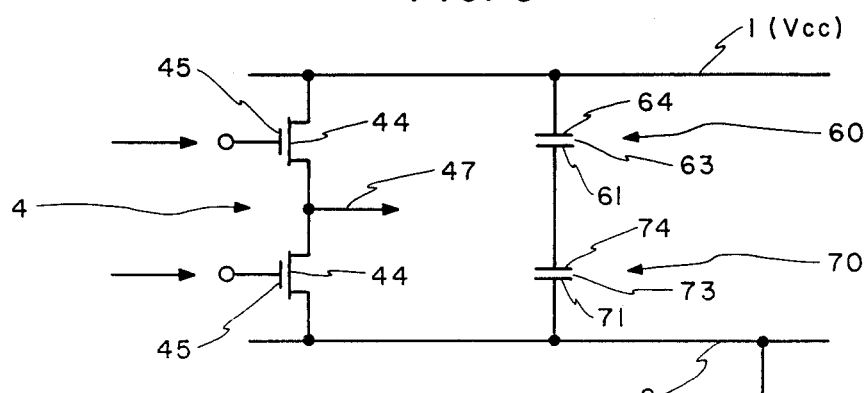
FIG. 5 is a circuit diagram of FIGS. 4A and 4B.
Figure 4A:
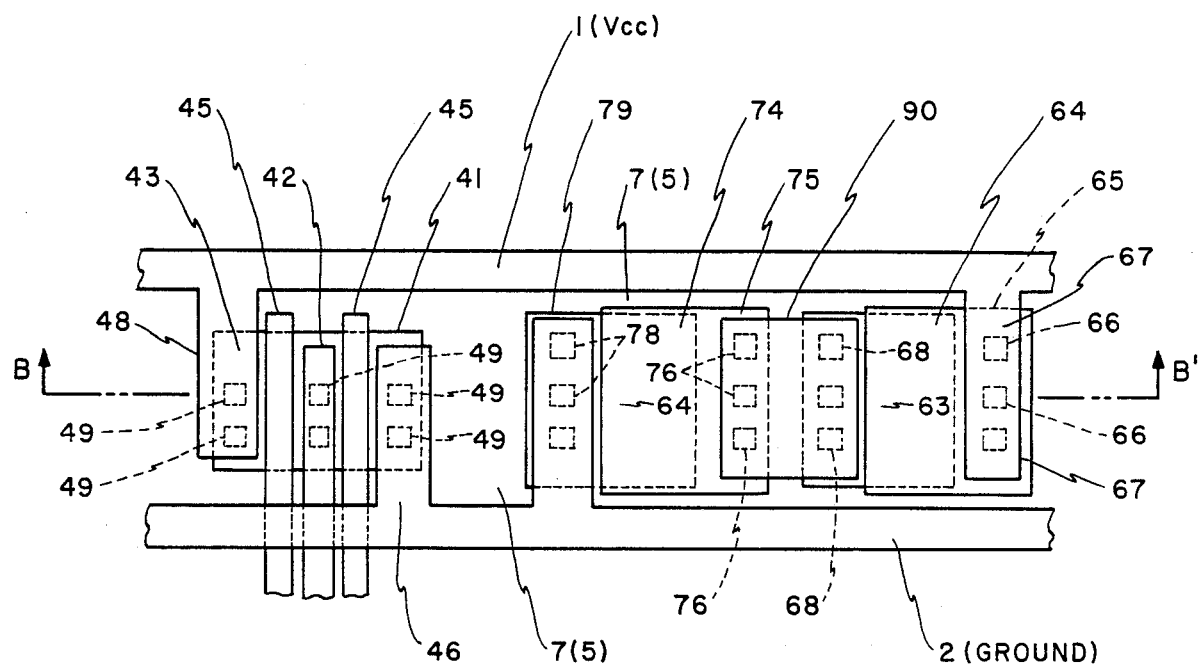
FIG. 4A is a plan view showing a part of the semiconductor device of FIG. 3 including the potential stabilizing circuit of the embodiment.
Figure 4B:
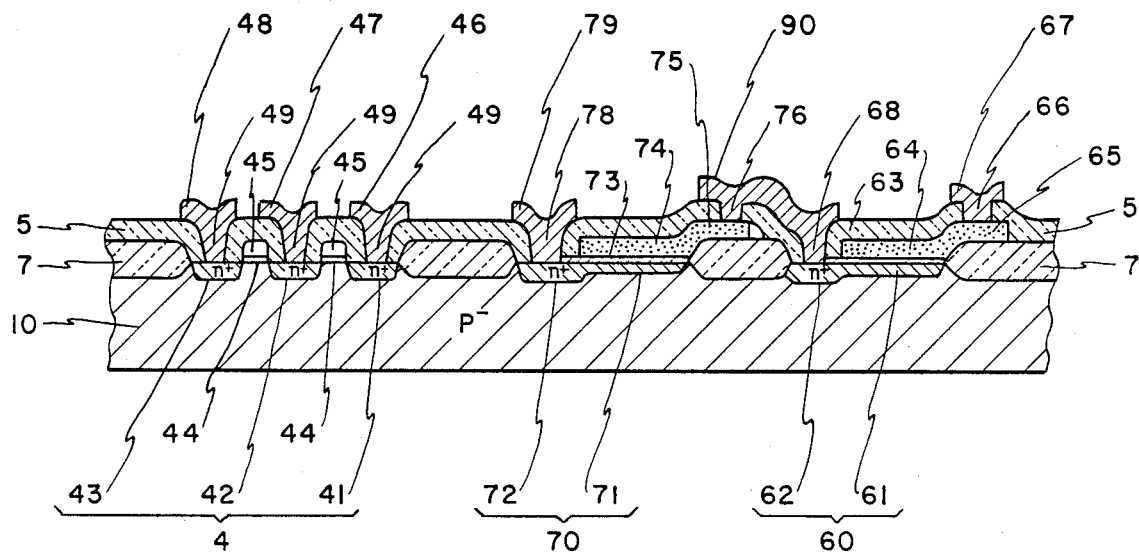
FIG. 4B is a cross-sectional view taken along line B—B' in FIG. 4A as viewed in the direction of arrows.

Referring to FIGS. 4 and 5, the first MOS type bypass capacitor 60 is constituted by an N⁺-type impurity region 61 formed in the substrate as the lower electrode, a thermally grown silicon oxide film 63 of 250 Å thickness formed on the impurity region 61 as the dielectric film, and a polycrystalline silicon electrode 64 formed on the silicon oxide film 63 as the upper electrode. An N⁺-type impurity region 62 is formed in the substrate and contacted continuously to the N⁺-type impurity region 61 such that the combined impurity region of 61 and 62 is surrounded by the field silicon oxide layer 7. The polycrystalline silicon electrode 64 extends on the field silicon oxide layer to form a contact portion 65. Also, the second MOS type bypass capacitor 70 is constituted by an N⁺-type impurity region 71 formed in the substrate as the lower electrode, a thermally grown silicon oxide film 73 of 250 Å thickness formed on the impurity region 71 as the dielectric film, and a polycrystalline silicon electrode 74 formed on the silicon oxide film 73 as the upper electrode. An N⁺-type impurity region 72 is formed in the substrate and contacted continuously to the N+-type impurity region 71 such that the combined impurity region of 71 and 72 is surrounded by the field silicon oxide layer 7. The polycrystalline silicon electrode 74 extends on the field silicon oxide layer to form a contact portion 75. A first aluminum wiring layer 67 is continuously formed from the Vcc line 1 and connected to the contact portion 65 of the upper electrode of the first bypass capacitor 60 through a plurality of contact holes 66 formed in the inter-ply insulating film 5, and a second aluminum wiring layer 79 is continuously formed from the ground potential line 2 and connected to the impurity region 72 of the second bypass capacitor 70 through a plurality of contact holes 78 formed in the inter-ply insulating film 5. Further, a third aluminum wiring 90 of a rectangular plan shape is formed and connected to the N+-type impurity region 62 of the first bypass capacitor 60 through a plurality of contact holes 68 formed in the inter-ply insulating film 5 and to the contact portion 75 of the upper electrode of the second bypass capacitor 70 through a plurality of contact holes 76 formed in the inter-ply insulating film 5.

According to the present embodiment, the dielectric films 63, 73 of the first and second bypass capacitors 60, 70 have the same thin thickness (250 Å) and the material (thermally grown silicon oxide) as the gate insulating films of the transistor 4 in the peripheral section 120 and of the switching transistor 113 in the memory cell forming section 110 (FIG. 3), and the dielectric films 63, 73 extend on a larger total area (four times) than the dielectric film 33 shown in FIG. 1 to obtain the same capacitance (100 pF to 1 μF, for example, 300 pF) between the power voltage supply lines 1, 2. However, the present embodiment increases its reliability greatly than the prior art structure shown in FIG. 1. For example, when semiconductor memory devices shown in FIGS. 3 to 5 are operated by increasing the Vcc voltage from the normal value of +5.0 volts to −8.0 volts under 200° C. during 1000 hours, at most one specimen (semiconductor memory device) is failured caused by the destruction of the dielectric films 63, 73 among 1000 specimens. Whereas, when the same semiconductor memory devices but installing the prior art potential stabilizing circuit shown in FIGS. 1 and 2 are operated under the same acceleration test conditions (Vcc=8.0 volts, 200° C., 1000 hours), four to six specimens are failured by the destruction of the dielectric film 33 among 1000 specimens.

What is claimed is:

1. A semiconductor device comprising a semiconductor substrate having a major surface of a first conductivity type, a thick field insulating layer selectively formed on said major surface of said substrate, a first power voltage supply line for supplying a first voltage extending on said thick field insulating layer, a second power voltage supply line for supplying a second voltage different from said first voltage extending on said thick field insulating layer, an insulated gate field effect transistor formed on said substrate, said transistor having a gate insulating film formed on said major surface of said substrate, a first impurity region of a second conductivity type opposite to said first conductivity type formed in said major surface of said substrate and surrounded by said thick field insulating layer, a first dielectric film formed on said first impurity region, said first dielectric film being made of the same material as said gate insulating film of said transistor and having the same thickness as said gate insulating film of said transistor, a first electrode formed on said first dielectric film, a second impurity region of said second conductivity type formed in said major surface of said substrate and surrounded by said thick field insulating layer, a second dielectric film formed on said second impurity region, said second dielectric film being made of the same material as said gate insulating film of said transistor and having the same thickness as said gate insulating film of said transistor, a second electrode formed on said second dielectric film, a first connecting means for connecting electrically said first power voltage supply line and said first impurity region each other, a second connecting means for connecting electrically said first electrode and said second impurity region each other, and a third connecting means for connecting electrically said second impurity region and said second power voltage supply line each other, whereby a first MOS type capacitor is constituted by said first impurity region, said first dielectric film and said first electrode; a second MOS type capacitor is constituted by said second impurity region, said second dielectric film and said second electrode; and a stabilizing circuit for suppressing a voltage fluctuation on said first and/or second power voltage supply line is constituted by the series connection of said first and second MOS type capacitors and is connected to and between said first and second power voltage supply lines.

2. A semiconductor device of claim 1, in which said thickness of said first and second dielectric film and of said gate insulating film ranges from 200 Å to 400 Å.

3. A semiconductor device of claim 1, in which said material of said first and second dielectric film and of said gate insulating film is silicon oxide.

4. A semiconductor device comprising a semiconductor substrate having a memory cell forming section and a peripheral section positioned outside said memory cell forming section, first and second power voltage supply lines formed on said peripheral section, respectively, at least one insulated gate field effect transistor formed on said peripheral section and having a gate insulating film, a plurality of MOS type capacitors formed on said peripheral section and connected each other in series to form a series connection of said capacitors, a first means for connecting one end of said series connection of said capacitors to said first power voltage supply line, and a second means for connecting the other end of said series connection of said capacitors to said second power voltage supply line, each of said capacitor having a dielectric film of the same thickness and material as said gate insulating film of said transistor.

5. A semiconductor device of claim 4, said thickness of said dielectric film and said gate insulating film ranges from 200 Å to 400 Å.

6. A semiconductor device of claim 4, in which said plurality of said capacitor are arranged in a direction parallel with said first and second voltage power supply lines.

* * * * *